United States Patent
Huo

(10) Patent No.: US 10,648,944 B2
(45) Date of Patent: May 12, 2020

(54) FAILURE ANALYSIS OF A MEASURING SENSOR WITH AN INTEGRATED TEMPERATURE SENSOR

(71) Applicant: Endress+Hauser Conducta Inc., Anaheim, CA (US)

(72) Inventor: Jinshan Huo, Corona, CA (US)

(73) Assignee: Endress+Hauser Conducta Inc., Anaheim, CA (US)

( * ) Notice: Subject to any disclaimer, the term of this patent is extended or adjusted under 35 U.S.C. 154(b) by 0 days.

(21) Appl. No.: 16/229,949

(22) Filed: Dec. 21, 2018

(65) Prior Publication Data

US 2019/0277802 A1 Sep. 12, 2019

Related U.S. Application Data

(63) Continuation-in-part of application No. 15/283,022, filed on Sep. 30, 2016.

(51) Int. Cl.
| | |
|---|---|
| *G01N 27/416* | (2006.01) |
| *G01N 27/02* | (2006.01) |
| *G01N 27/36* | (2006.01) |
| *G01R 27/02* | (2006.01) |

(52) U.S. Cl.
CPC ......... *G01N 27/4165* (2013.01); *G01N 27/36* (2013.01); *G01R 27/02* (2013.01)

(58) Field of Classification Search
CPC ..... G01N 27/4165; G01N 27/02; G01N 27/36
See application file for complete search history.

(56) References Cited

U.S. PATENT DOCUMENTS

| | | | | |
|---|---|---|---|---|
| 9,739,546 | B2* | 8/2017 | Bertilsson | F28F 3/083 |
| 2004/0237338 | A1* | 12/2004 | Rump | D06F 58/203 |
| | | | | 34/607 |
| 2015/0164371 | A1* | 6/2015 | Varsavsky | A61B 5/0537 |
| | | | | 600/347 |
| 2015/0351670 | A1* | 12/2015 | Vanslyke | A61B 5/1495 |
| | | | | 600/301 |
| 2018/0095054 | A1* | 4/2018 | Huo | G01N 27/026 |

* cited by examiner

*Primary Examiner* — Christopher P McAndrew
*Assistant Examiner* — Zannatul Ferdous
(74) *Attorney, Agent, or Firm* — Christopher R. Powers; PatServe

(57) ABSTRACT

According to at least one aspect of the present disclosure, a method includes applying an alternating current at a selected voltage to a sensor, wherein the voltage is applied between a working electrode and/or reference electrode of the sensor and a temperature sensor integrated into the sensor, varying the frequency of the alternating current between a lower frequency and an upper frequency, measuring an impedance of the sensor between the working electrode and/or reference electrode and the temperature sensor as a function of the frequency of the alternating current, and determining whether, based on the total impedance at the low frequency end of the sensor and on the real and imaginary components of the impedance, the insulations between working electrode and/or reference electrode and temperature sensor have a defect.

20 Claims, 14 Drawing Sheets

FAILURE ANALYSIS OF A MEASURING SENSOR WITH AN INTEGRATED TEMPERATURE SENSOR

CROSS-REFERENCE TO RELATED APPLICATION

The present application is related to and claims the priority benefit of U.S. patent application Ser. No. 15/283,022, filed on Sep. 30, 2016, the entire contents of which are incorporated herein by reference.

TECHNICAL FIELD

The present disclosure generally relates to characterizing measuring sensors, particularly characterizing electrochemical measuring sensors.

BACKGROUND

Measuring sensors, particularly electrochemical measuring sensors, are widely used for quality monitoring, process control and research in agriculture, beverages, foods, water, various industries and research labs. Such measuring sensors include pH sensors. A critical component of a pH sensor is a pH glass membrane. Generally, pH glass material used in the pH glass membrane is specially formulated to make the material sensitive to hydrogen ions (W).

Conventionally, to test and verify the proper functioning of a pH sensor, the sensor is placed in contact with a standard buffer solution of known pH (e.g., pH 4, 7 and 10 buffers), and the sensor's signal output is displayed and verified using a pH meter. Certain pH meters include a function to measure glass impedance. However, such meters are not accurate enough or capable to distinguish sensor failure modes, such as a crack in the glass membrane or a short circuit in the sensor.

If in case a sensor failed to work normally, for whatever reason (e.g., harsh application conditions, inappropriate selection of sensor type, manufacturing processes, changes of material/part supply etc.), physical examination and often destruction (e.g., dissection) of the sensor has previously been the only way to determine the failure mode and root cause of failure of the sensor. However, dissecting a pH sensor can be very time consuming. In addition, it is not guaranteed to see root cause after dissection. For example, a micro-crack at the pH glass membrane glass stem interface in transversal direction may not be visible. More often, dissection can easily damage the signs of root cause because of the complex construction of a pH sensor, which is usually built with materials of wide range mechanical and physical properties—from liquid and soft rubber, to hard plastic, rigid epoxy, and very hard but brittle glass.

Accordingly, there remains a need for further contributions in this area of technology to enable a method to characterize failure modes and to determine the root cause of such failures a measuring sensor.

BRIEF SUMMARY

According to at least one aspect of the present disclosure, a method for characterization and failure analysis of a measuring sensor is disclosed. The method includes applying an alternating current having a frequency at a selected voltage to a sensor, where the voltage is applied between a reference electrode and a working electrode of the sensor. The frequency of the alternating current is varied between a lower frequency and an upper frequency over a range from a lower frequency end to an upper frequency end. The method includes measuring an impedance of the sensor between the reference electrode and the working electrode over the range of frequencies of the alternating current. The measured impedance is analyzed to determine one or more total impedance of the sensor and the real and imaginary components of the one or more total impedance at and over the applied frequencies of the alternating current. The sensor is characterized based on the one or more total impedance and on the real and imaginary components of the one or more total impedance.

According to a further aspect of the present disclosure, a method for characterization and failure analysis of a measuring sensor is disclosed, where the measuring sensor includes an integrated thermocouple sensor. In such an embodiment, the method includes applying an alternating current having a frequency at a selected voltage to a measuring sensor, wherein the voltage is applied between a working electrode of the measuring sensor and a temperature sensor integrated into the measuring sensor and/or between a reference electrode of the measuring sensor and the temperature sensor, wherein the measuring sensor includes an ion-sensitive membrane and electrical insulation between the temperature sensor, the working electrode and the reference electrode. The frequency of the alternating current is varied between a lower frequency and an upper frequency over a range from a lower frequency end to an upper frequency end. The method includes measuring an impedance of the measuring sensor between the working electrode and the temperature sensor, and/or between the reference electrode and the temperature sensor, over the range of frequencies of the alternating current. The measured impedance is analyzed to determine a total impedance between the working electrode and the temperature sensor, and/or between the reference electrode and the temperature sensor, and the real and imaginary components of the total impedance at and over the applied frequencies of the alternating current. The method includes determining whether, based on the total impedance and on the real and imaginary components of the total impedance, the measuring sensor has a defect involving the temperature sensor. The method can further include generating a measured impedance frequency response spectrum.

In an embodiment, the determining includes identifying whether the total impedance at the low frequency end between the working electrode, and/or the reference electrode, and the temperature sensor is below a lower threshold. In such an embodiment, the method determines a measuring sensor in which the total impedance at the low frequency end is below the lower threshold has a defect in the insulation between working electrode and temperature sensor or between reference electrode and temperature sensor. In such an embodiment, the lower threshold may be based at least in part on a membrane impedance of the ion-sensitive membrane of the measuring sensor. The lower threshold is around 15 gigaohms when the membrane impedance is about 100 megaohms. The lower threshold is around 25 gigaohms, when the membrane impedance is about 500 megaohms.

In an embodiment, the method further includes generating a Nyquist plot of a measured impedance frequency response spectrum, wherein a measuring sensor in which the total impedance at the low frequency end is below the lower threshold and the measured impedance frequency response spectrum deviates toward a positive real component at the low frequency end in the Nyquist plot is determined to have a defect in the insulation between working electrode and temperature sensor or between reference electrode and temperature sensor. In such an embodiment, the measured impedance frequency response spectrum deviates toward a positive real component in the Nyquist plot when a ratio of the imaginary to real components of the measured impedance at the low frequency end is less than a target ratio, wherein the target ratio is at least partially based on a membrane impedance of the ion-sensitive membrane of the measuring sensor.

In an embodiment, the method further includes data fitting the measured impedance to generate a simulated response spectrum and applying an equivalent circuit model to the simulated response spectrum to estimate the capacitance, resistance and Warburg coefficient of the measuring sensor. In such an embodiment, the determining includes predicting a performance of the measuring sensor using the estimated the capacitance, resistance and Warburg coefficient.

In an embodiment, the analyzing includes generating a plot of the measured impedance as a function of the frequency of the alternating current to yield a frequency response spectrum. The plot may be a Nyquist plot.

In an embodiment the frequency of the alternating current is varied over a spectrum. Or alternately the frequency of the alternating current is varied between discrete predetermined frequencies. In an embodiment, the measuring sensor is a pH sensor.

The sensor may be analyzed as a step in a quality control process. The analysis may include determining a failure mode of the sensor and/or checking a status of the sensor.

In an embodiment, the sensor includes equipment suitable to perform the measuring of the impedance of the sensor. In such an embodiment, the equipment may be integrated into a plug head of the sensor.

BRIEF DESCRIPTION OF THE DRAWINGS

The described embodiments and other features, advantages and disclosures contained herein, and the manner of attaining them, will become apparent and the present disclosure will be better understood by reference to the following description of various embodiments of the present disclosure taken in junction with the accompanying drawings, wherein.

DETAILED DESCRIPTION

Figure 1:
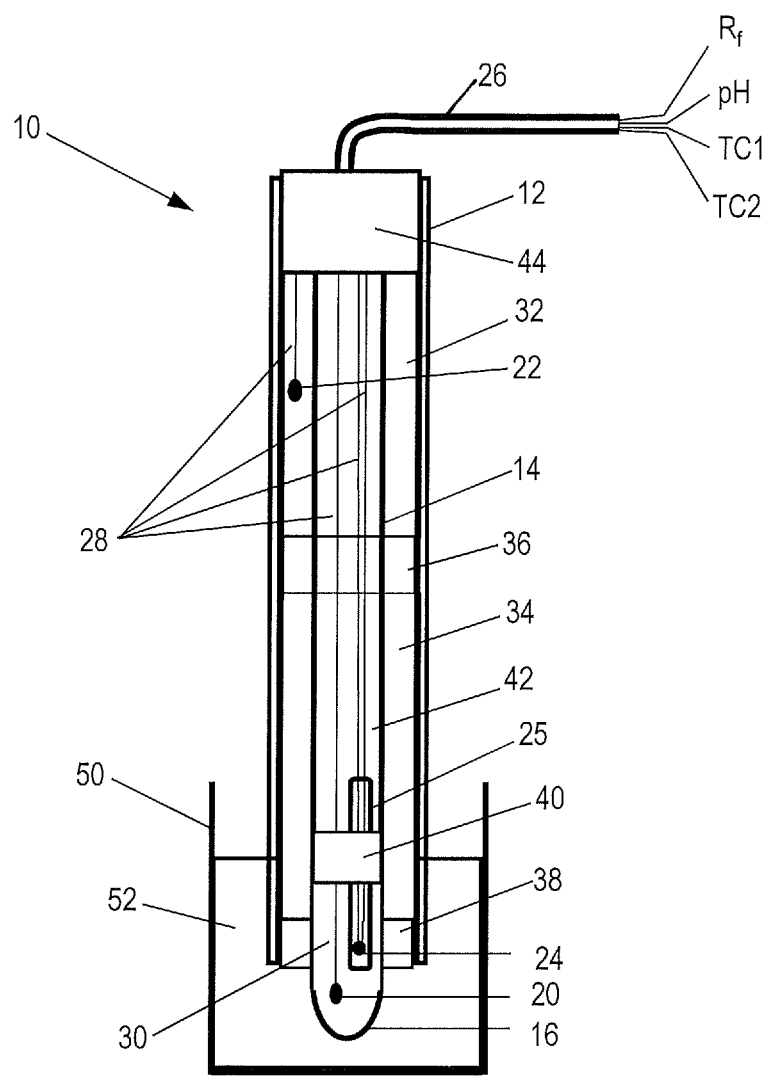
FIG. 1 shows a cross-sectional view of a sensor, according to an embodiment of the present disclosure.

The present application discloses various embodiments of methods for characterization and failure analysis of a measuring sensor. According to one aspect of the present disclosure, methods of applying measured impedance frequency response spectra to sensor characterization are disclosed. According to a further aspect of the present disclosure, methods of applying measured impedance frequency response spectra to sensor failure mode analysis are disclosed, specifically with respect to pH sensors. In certain aspects, the disclosed methods may generally apply a form of electrochemical impedance spectroscopy (EIS). For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended. In particular, the disclosed methods may be applied to measuring sensors other than pH sensors, specifically to electrochemical measuring sensors.

FIG. 1 illustrates a sensor 10 placed in a reservoir 50 containing a test solution 52. The sensor 10 may be an electrochemical measuring sensor including a reference cell containing an internal electrolyte. In certain embodiments, the sensor 10 is a pH sensor. The sensor 10 may include a sensor body 12 within which a tube 14 is disposed. The tube 14 may be a glass tube. As shown in FIG. 1, the tube 14 may include a membrane 16 affixed to a distal end of the tube 14 and a front seal 40, thereby defining a volume containing a first electrolyte 30. The membrane 16 may be a glass membrane made of doped glass formulated to be sensitive to a specific ion. In embodiments in which the sensor 10 is a pH sensor, the membrane 16 is sensitive to hydrogen ions (i.e., $H^+$). A working electrode 20 may be disposed within the first electrolyte 30 such that the working electrode 20 is in electrochemical communication with the test solution 52 through the membrane 16. In embodiments where the sensor 10 is a pH sensor, the working electrode 20 may be referred to as a pH electrode. In certain embodiments, the working electrode 20 may be a silver chloride electrode (i.e., a Ag/AgCl electrode); nonetheless, other types of electrodes are applicable.

The sensor 10 may further include a reference electrode 22 positioned within a volume defined by the sensor body 12, a back seal 44, which seals the proximal ends of both the sensor body 12 and the tube 14, and a middle junction 36, which seals the gap between the sensor boy 12 and the tube 14, such that the defined volume contains a second electrolyte 32. In certain embodiments, the reference electrode 22 may be a silver chloride electrode (i.e., a Ag/AgCl electrode). In certain embodiments, the sensor 10 may include a front junction 38 disposed at the distal end of the sensor body 12 such that the front junction 38 seals the gap between the sensor body 12 and the tube 14 and therewith defines a volume containing a third electrolyte 34. In certain embodiments, as shown in FIG. 1, the sensor 10 may include a temperature sensor 24 disposed adjacent the working electrode 20 and in the first electrolyte 30, which measures the temperature of the first electrolyte 30 and thereby indicates the temperature of the test solution 52. The working electrode 20, reference electrode 22 and the temperature sensor 24 may include lead lines 28 that pass through the back seal 44, are bundled together in a cable 26, and enable electrical communication between these components of the sensor 10 and external sources and meters (not shown). While FIG. 1 illustrates a double junction pH sensor, the disclosed methods may be applied to single junction pH sensors as well as other types of electrochemical measuring sensors.

Where the sensor 10 is a pH sensor, when sensor 10 is placed in contact with the test solution 52, the charge distributions at the interfaces of the membrane 16 to test solution 52 and of the membrane 16 to first electrolyte 30 are strongly affected by the H+ ions in the test solution 52. At equilibrium, the potential at membrane/test solution interface, $E_{g/s}$, is a function of ft activity, $a_{H^+}$:

$$E_{g/s} \sim 2.3026\frac{RT}{F}\log(a_{H^+}) \quad \text{[EQN. 1]}$$

where R is the molar gas constant 8.3144 J mol$^{-1}$ K$^{-1}$, T is the temperature in Kelvin, F is the Faraday constant 96,485.3 C·mol$^{-1}$, and 2.3026 is a conversion between natural and common logarithm. Since the pH of the first electrolyte 30 within the membrane 16, the potential of working electrode 20, and the potential of the reference electrode 22 are all constants, the overall potential difference between pH and Ref electrodes is:

$$\Delta E_{pH-Ref} = E' + 2.3026\frac{RT}{F}\log(a_{H^+}) \quad \text{[EQN. 2]}$$

where E' is constant. Since pH is defined as pH=$-\log(a_{H+})$, at given temperature, there is linear relationship between $\Delta F_{pH-Ref}$ and pH:

$$\Delta E_{pH-Ref} = E' - 1.98 \times 10^{-4} \, T \cdot pH \quad \text{[EQN. 3]}$$

For example, $\Delta E_{pH-Ref}$ is 177.5 mV at pH 4, 0 mV at pH 7, and −177.5 mV at pH 10 at 25° C.; with slope −59.1667. A properly functioning sensor 10 should follow EQN. 3, such that its voltage reading $\Delta E_{pH-Ref}$ in pH buffer 7 should be 0 mV and the slope should be about −59.17 at 25° C. Usually a small error (e.g., ±12 mV) is acceptable and defined in the specification of the sensor 10.

Given the complexity of the assembly, the sensor 10 may be manufactured with defects that harm the performance of the sensor 10 in operation. For example, poor manufacturing processes, planned and unplanned changes of material or part supply, bad in-coming material or handling, etc. Alternatively, defects may develop during operation due to various factors, such as harsh application conditions, inappropriate selection of sensor, end of life span, wear, etc. One aspect of the present disclosure includes a method to characterize and analyze a sensor to facilitate root cause failure analysis of the sensor without further damaging the sensor under test. In at least one embodiment of the present disclosure, a method of applying measured impedance frequency response spectra to characterize and analyze electrochemical measuring sensors is disclosed. The method will be disclosed with respect to the characterization and analysis of a pH sensor. Nonetheless, the method may be applied to other types of electrochemical sensors, such as electrochemical measuring sensors.

Figure 2:
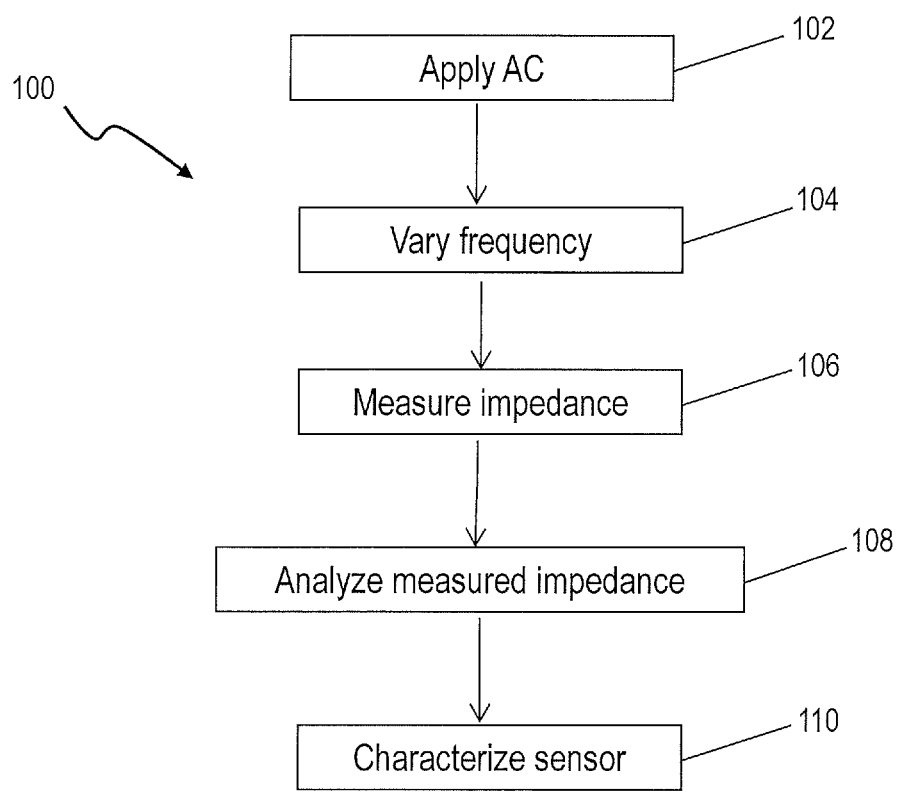
FIG. 2 illustrates a method of characterizing a sensor, according to an embodiment of the present disclosure.

In at least one embodiment of the present disclosure as shown in FIG. 2, a method 100 of characterization and failure analysis of the sensor 10 includes a step 102 of applying an alternating current (AC) at a selected voltage to the sensor 10 between the reference electrode 22 and the working electrode 20. For example, the selected voltage may be relatively small to prevent damaging the sensor 10 but large enough to generate a response from the sensor 10. In at least one embodiment, the selected voltage is around 100 millivolts (mV). The method 100 includes a step 104 of varying the frequency of the AC between a lower frequency and an upper frequency over a range having a low frequency end and an upper frequency end.

In the step 104, the frequency of the applied AC may be varied over a wide range having a low frequency end and an upper frequency end. As used herein, "end" may include a discrete frequency in the range; additionally and alternatively, "end" may include several frequencies toward an end region of the range. For example, the range may extend from 1 megahertz (MHz) to 0.01 Hz. In certain embodiments, the frequency of the applied AC may be varied through a scan over a narrower range, such as 300 kHz to 0.01 Hz. In further embodiments, the frequency of the applied AC may be varied in discrete steps between discrete predetermined frequencies from one desired frequency to the next. In such an embodiment, for example, discrete frequencies of 300 kHz, 100 kHz, 50 kHz, 10 kHz, 1 kHz, 1 Hz and 0.01 Hz may be applied to the sensor 10. Accordingly, the varying of the frequency of the AC may include scanning through the desired range of frequencies and selecting discrete frequencies in the range. The AC may be applied by any suitable controlled power source. In at least one embodiment, a potentiostat/galvanostat may be employed to apply the desired frequencies and the selected voltage.

The method 100 further includes a step 106 of measuring an impedance of the sensor 10 between the reference electrode 22 and the working electrode 20 over the range of frequencies of the alternating current. The step 106 may include measuring the impedance frequency response of the sensor 10 or the electrochemical impedance spectrum (EIS) of the sensor 10. The impedance may be measured by any suitable instrument, for example, a potentiostat/galvanostat. In at least one embodiment of the present disclosure, equipment suitable to perform the measuring of the impedance of the sensor may be included in the sensor. Further, the sensor may include equipment suitable to perform all or part of the method 100. For example, the sensor may include hardware, software and firmware suitable to perform all or part of the method 100. In such an embodiment, the equipment may be integrated into a plug head of the sensor. In certain embodiments, the equipment may at least partially include the functionality of a potentiostat/galvanostat.

The method 100 may include a step 108 of analyzing the measured impedance to determine one or more total impedance of the sensor 10 and the real and imaginary components of the one or more total impedance at and over the applied frequencies of the AC. In the step 108, the analysis may include generating a measured impedance frequency response spectrum. The analysis may further include plotting the imaginary part of the total impedance against the real part of the total impedance for the various frequencies to generate a Nyquist plot. The analysis may further include determining a real/imaginary component ratio at various frequencies based the real and imaginary components of the total impedance at a given frequency.

The method 100 may further include a step 110 of characterizing the sensor 10 based on the one or more total impedance of the sensor 10 and on the real and imaginary components of the total impedance. In the step 110, the characterization may be qualitative and/or quantitative as discussed further herein. In certain embodiments, the step 110 includes identifying the failure mode of an improperly operating sensor based on the total impedance of the sensor 10 and on the real and imaginary components of the total impedance. The step 110 may further include determining the root cause of such failure modes. In an alternative application, the method 100 may be used as a quality control measure to qualify newly manufactured sensors before they are employed in the field. 20. In a further embodiment, the characterizing of the sensor includes checking a status of the sensor in operation.

The method 100 has been applied to both functioning and malfunctioning pH sensors in a series of experiments that demonstrate the effectiveness of the method 100. The experiments were conducted on pH sensors manufactured by the Applicant and on pH sensors manufactured by other manufacturers, as noted, using a PMC CHS08A Potentiostat/Galvanostat and 3M KCl solution in a Gamry VistaShield Faraday cage. An AC signal of 100 mV was applied between the working and reference electrodes with a frequency scan from 300 kHz to 0.01 Hz, unless noted otherwise. In certain cases as discussed, the AC signal was applied between the sensor reference electrode and an external reference electrode. pH testing was conducted using Applicant's CM42 pH meter and 200 mL each of pH buffer solutions of 4, 7 and 10 pH.

Figure 3:
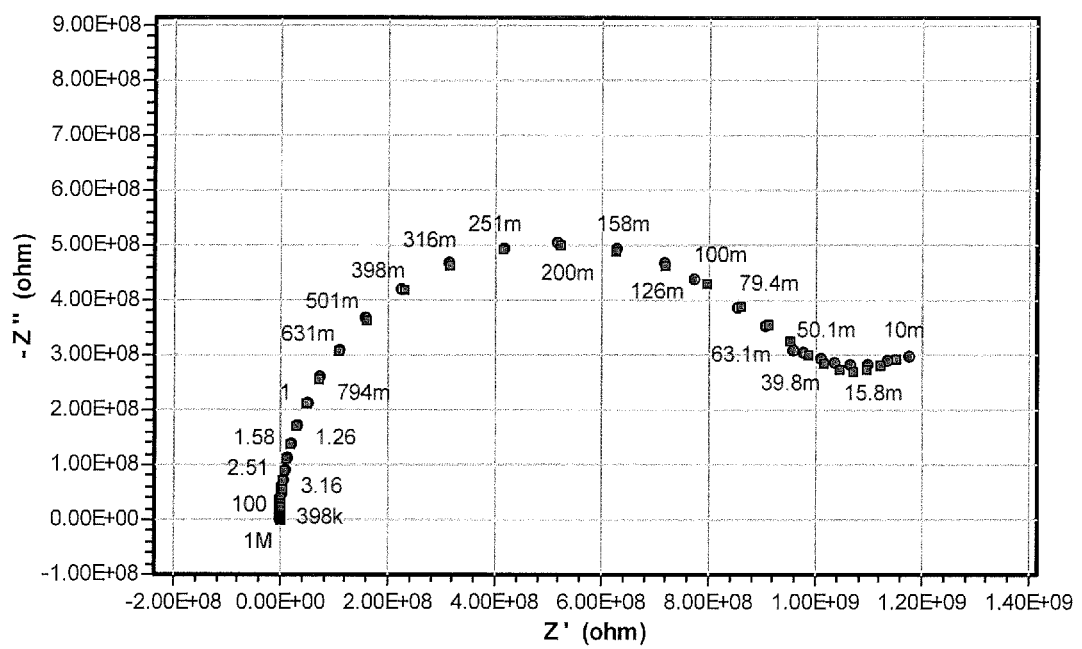
FIG. 3 shows a Nyquist plot of an impedance frequency response spectrum of a properly functioning sensor, according to an embodiment of the present disclosure.

FIG. 3 shows the measured impedance frequency response spectrum of a properly functioning Test Sensor 1. In FIG. 3, the impedance response has been presented in a Nyquist plot with the real part of the total impedance plotted on the x-axis and the imaginary part of the total impedance plotted on the y-axis. Qualitatively, the Nyquist plot exhibits a semicircular portion with a tail at the low frequency end of the response spectrum. Quantitatively, both the real and imaginary parts of the total impedance are positive (i.e., greater than zero) and are in the expected range for the Test Sensor 1. Further, the total impedance at the low frequency end, around 1000 megaohms (MΩ), is also in the expected range for the test sensor.

Figure 4A:
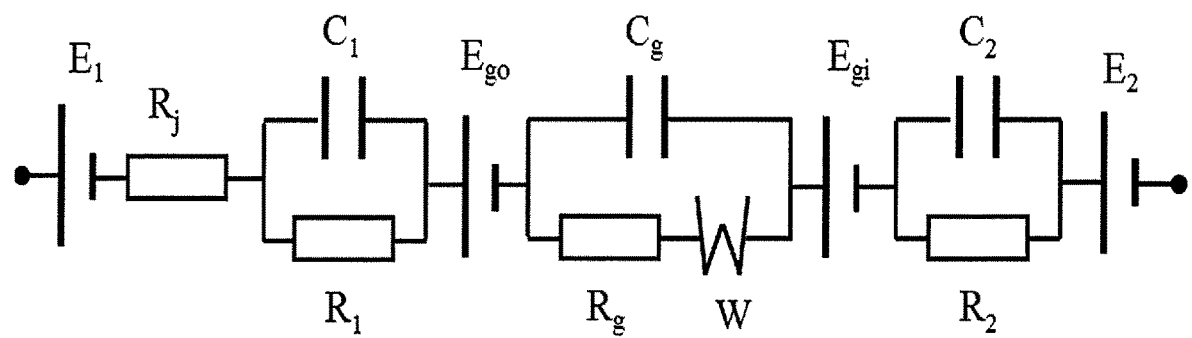
FIGS. 4A and 4B show equivalent circuits, according to exemplary embodiments of the present disclosure.

The electrical behavior of a pH sensor, such as the sensor 10 as shown in FIG. 1, can be characterized with an equivalent circuit, as shown in FIG. 4A. In FIG. 4A, $E_1$ and $E_2$ are the potentials of the reference electrode 22 and the working (i.e., pH) electrode 20, respectively, which are constants and depend on the electrode materials and the first electrolyte 30 and second electrolyte 32 that surround their respective electrodes (i.e., the working electrode 20 and the reference electrode 22). $R_j$ is the total resistance of front and middle junctions 38, 36, the first, second and third electrolytes 30, 32, 34, and the leads 28. $C_1$ and $C_2$ are the double layer capacitances of the reference electrode 22 and the working electrode 20, respectively. $R_1$ and $R_2$ are the electrode/electrolyte resistances of the reference electrode 22 and the working electrode 20, respectively. $C_g$ and $R_g$ are the capacitance and charge transfer resistance across the membrane 16. $E_{go}$ and $E_{gi}$ are the potentials of the outside and inside surfaces of the membrane 16. W is the Warburg coefficient or diffusion element, which includes the diffusion resistance of the membrane 16 and has units of $\Omega \cdot s^{-1/2}$. The Warburg coefficient may also be represented by "σ".

The impedance of the Warburg diffusion element can be expressed as:

$$Z_w = \sigma/\omega^{1/2} - j\sigma/\omega^{1/2} \quad \text{[EQN. 4]}$$

where $\omega = 2\pi f$, f is frequency, σ is Warburg coefficient (ohm·s$^{-1/2}$). The Warburg coefficient can be calculated from the admittance, $Y_o$, which may be obtained from data fitting by simulation software:

$$\sigma = \frac{\sqrt{2}}{2Y_o} \quad \text{[EQN. 5]}$$

Figure 4B:
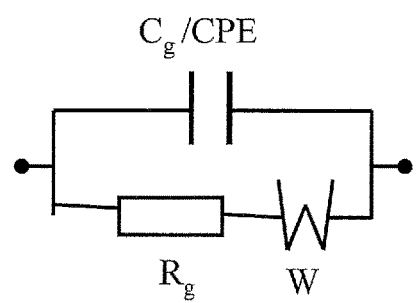

Among the components in FIG. 1, the impedance of membrane 16 (i.e., $C_g/(R_g W)$) of a conventional pH sensor is typically in a range of hundreds of megaohms (MΩ) and can be as high as a few gigaohms (GΩ). In comparison, the impedances of the other components are very small. Hence, the equivalent circuit can be simplified as shown in FIG. 4B. Referring to FIG. 3, the circular data points plot the measured impedance data. The square data points are fitting points obtained using data fitting/simulation software, ZSimpWin, to fit the equivalent circuit model of FIG. 4B to the measured impedance. For the data presented in FIG. 3, the data fit calculated an equivalent $C_g = 7.2 \times 10^{-4}$ µF, $R_g = 946$ ΩΩ and W=$5.89 \times 10^7$ Ωs$^{-1/2}$. These values are in line with expected capacitance, resistance and diffusion resistance of a properly functioning pH sensor.

A Nyquist plot of certain sensors may exhibit a semicircular portion that appears to be slightly compressed in vertical axis, yet with or without the characteristic tail at the low frequency end of the response spectrum. Such a slightly compressed appearance indicates that the simulation component, $C_g$, is not an ideal capacitor. With such a sensor, the equivalent circuit of FIG. 4B should include a constant phase element (CPE) instead of $C_g$ for generate a more accurate data fit. The corresponding capacitance value then can be calculated from the following equations:

$$\frac{1}{Z} = Y = Q_o(j)^n \quad \text{[EQN. 6]}$$

$$C = Q_o(\omega_{max})^{n-1} \quad \text{[EQN. 7]}$$

where Z is CPE impedance, Y is Admittance, $Q_o$ and n can be obtained from data fitting by simulation software, 0<n<1; for pure capacitor, n=1. Accordingly, the simulation software can vary the n parameter to best fit the data and calculate the corresponding capacitance value.

Figure 5:
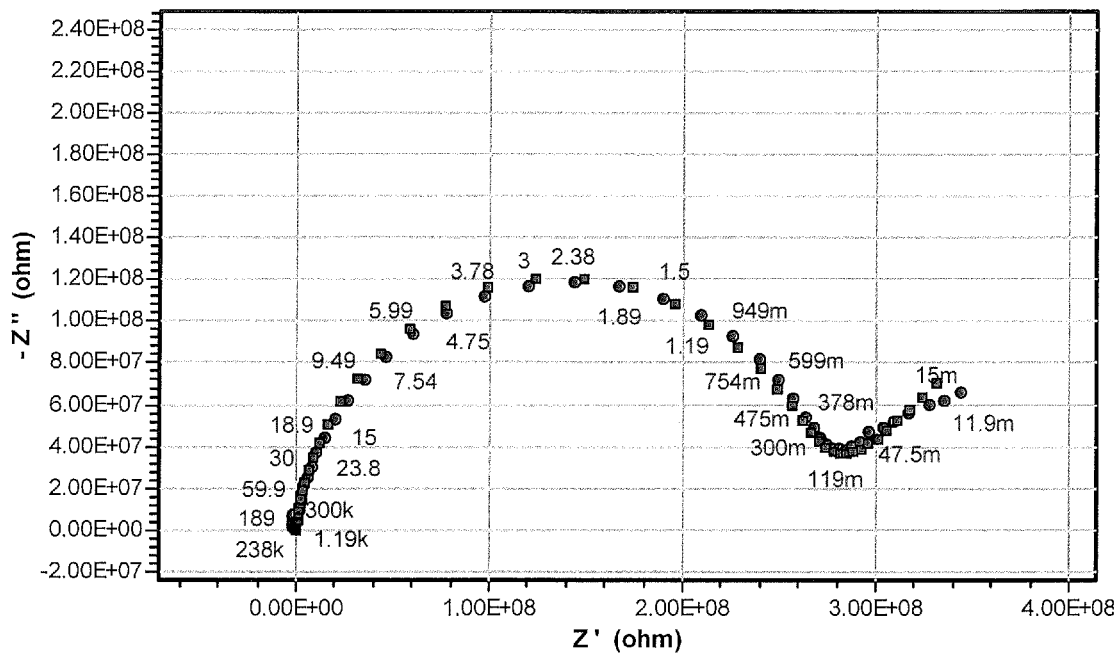
FIG. 5 shows a Nyquist plot of an impedance frequency response spectrum of a properly functioning sensor, according to an embodiment of the present disclosure.

FIG. 5 shows the measured impedance frequency response spectrum of a properly functioning Test Sensor 2, which is slightly different than that of Test Sensor 1 and, can be best fit with CPE instead of $C_g$. In FIG. 5, the square data points are fitting points obtained using the simulation software to fit the equivalent circuit using CPE, to the measured impedance. The data fit calculated an equivalent $C_g = 2.07 \times 10^{-4}$ µF (where $Q_o = 2.5 \times 10^{-10}$ S·s$^n$ and n=0.93), $R_g = 265$ MΩ and W=$1.91 \times 10^7$ Ω·s$^{-1/2}$. These values are in line with expected capacitance, resistance and diffusion resistance of a properly functioning pH sensor. Thus, FIGS. 3 and 5 demonstrate how the method 100 can be used to characterize the performance of sensors.

Referring to FIG. 1, the components that can directly affect sensor performance include the membrane 16, working and reference electrodes 20, 22, the middle and front junctions 36, 38, the first, second and third electrolytes 30, 32, 34, and the front, middle and back seal 40, 42, 44 contacting the electrolytes. Any defect with the materials, solutions or structural integrity of these components may cause a sensor, namely a pH sensor, malfunction. Some of the commonly encountered failure modes in pH sensors include cracking, including micro-cracking, of membrane 16, electrolyte contamination, short circuit between electrodes, and poor insulation. Applicant discovered that certain characteristics of a measured impedance frequency response spectrum can be used to analyze and identify different failure modes in sensors. Accordingly, the method 100 was applied to pH sensors of different types having different defects embodied therein in several experiments described herein.

Experiment 1

Two sensor types (A: single junction pH sensor with liquid reference electrolyte; B: double junction pH sensor with wetted solid reference electrolyte) and totally six sensors were analyzed using the method 100. An initial pH test was conducted on each sensor in three buffer solutions, pH 4, 7 and 10 using the CM42 pH meter. The voltage output results (in mV) are contained in Table 1. The test data indicate that each of the sensors was not working properly except B-3, which was within specification in all three buffer solutions.

TABLE 1

Initial pH Test Data

| Sensor | mV reading in pH buffers | | | impedance (MΩ) in buffer 4 | mV reading pH - Ref (ext.) in buffer 4 | mV reading Ref - Ref (ext.) in buffer 4 |
|---|---|---|---|---|---|---|
| | 4<br>177.5 ± 12 | 7<br>0 ± 12 | 10<br>−177.5 ± 12 | | | |
| A-1 | | no reading | | 0 | 64 | no reading |
| A-2 | | no reading | | 0 | 163 | no reading |
| A-3 | 124 | −45 | −216 | 525 | 176 | 45 |
| B-1 | 107 | 11 | −85 | 583 | 179 | no reading |
| B-2 | 128 | 24 | −124 | 444 | 175 | no reading |
| B-3 | 168 | −6 | −180 | 759 | 180 | no reading |

Sensors A-1 and A-2 both showed zero impedance between pH and reference (Ref) electrodes, no pH (in mV) reading in all pH buffers. Note: a feature of the CM42 pH meter is to display no pH or mV reading when membrane impedance is too low. Sensors A-1 and A-2 further exhibited no reading from the reference electrode against an external reference electrode (i.e., Ref(ext.)). These results suggest that the sensors might have cracked pH glass bulbs, short circuits, or current leakage between the reference chamber and internal pH electrolyte through a cracked pH glass stem. The working to reference electrode output voltage (i.e., pH-Ref(ext)) reading of Sensor A-2 is slightly lower than specification, indicating the membrane is functioning but with some problem. The working to reference electrode output voltage reading of Sensor A-1 is much lower than specification but not zero. Such a result does not provide a clear clue about the failure. Conventionally, physical dissection and destruction of the sensor would to be the only way to identify the root cause of the failure.

Figure 6A:
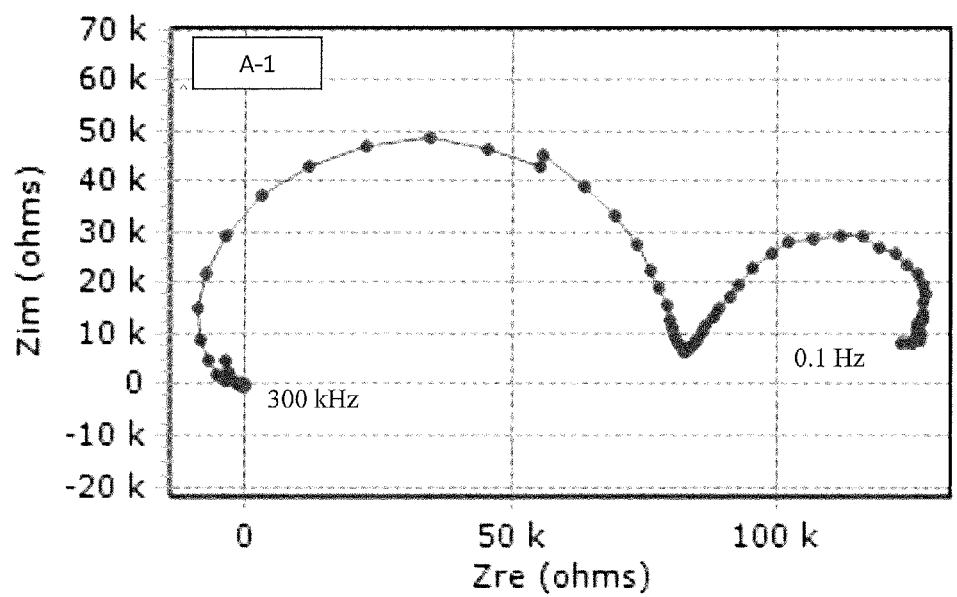
FIGS. 6A-6C show Nyquist plots of impedance frequency response spectra of exemplary defective sensors, according to an embodiment of the present disclosure.
Figure 6B:
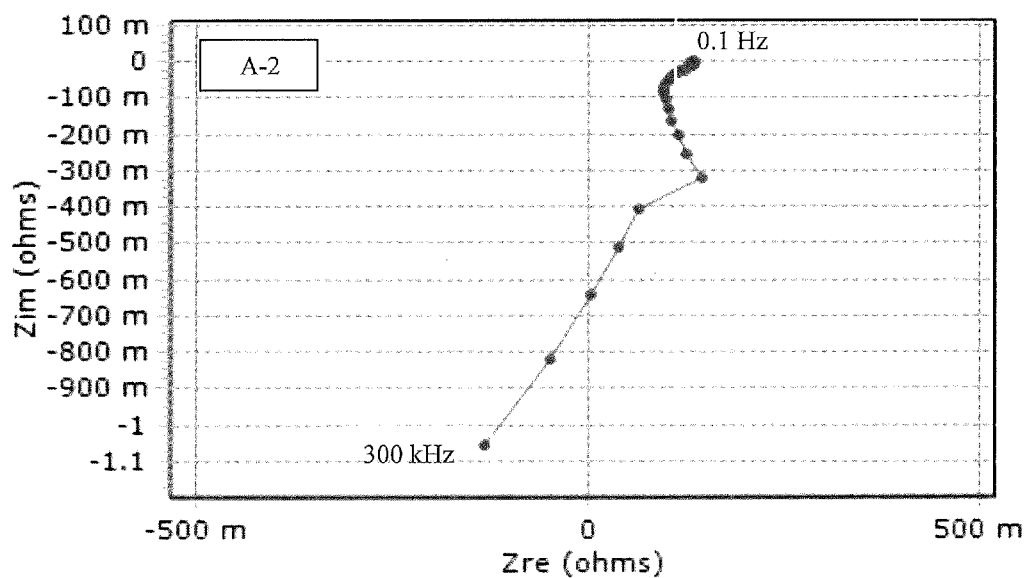
Figure 6C:
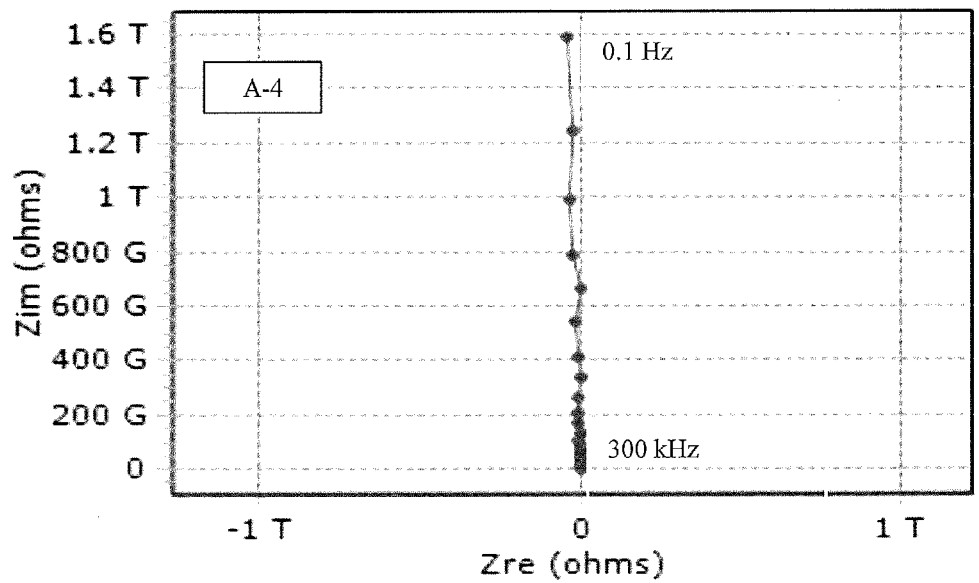

Applying the method 100, the measured impedance frequency response spectra of Sensors A-1 and A-2 clearly exhibit very different characteristics, as shown in FIGS. 6A and 6B. FIG. 6A shows a Nyquist plot of the response of Sensor A-1, showing two deformed semicircles with a total impedance less than 1 MΩ. Applicant has found that such a measured impedance frequency response spectrum is typical of a cracked membrane, for example, cracked pH bulbs. FIG. 6B shows a Nyquist plot of the response of Sensor A-2, showing an inductive component (i.e., negative imaginary impedance) and about zero total impedance. Applicant has found that such a measured impedance frequency response is typical of a short circuit, such as at the back seal or cable. A Sensor A-4 (not included in Table 1) containing an open circuit was evaluated using the method 100. FIG. 6C shows a Nyquist plot of the response of Sensor A-4, showing a nearly vertical line indicating extremely large (e.g., greater than 1 GΩ) total impedance with a positive imaginary part but nearly zero real part. Applicant has found that such a measured impedance frequency response is typical of an open circuit. These reported failure modes and correlated impedance frequency response characteristics have been corroborated and proven by physical dissection of Sensors A-1 and A-2 and many other test sensors.

The data in Table 1 indicate that Sensors A-3, B-1 and B-2 had glass impedance in normal range and a good pH-Ref (ext) reading, which suggest that the cause of failure is very likely due to the malfunction of their reference cells. Failure of the internal reference cell in these sensors was further confirmed with a measurement of their impedance frequency responses between the internal reference electrode (Ref) and an external reference electrode (Ref(ext)).

Figure 7:
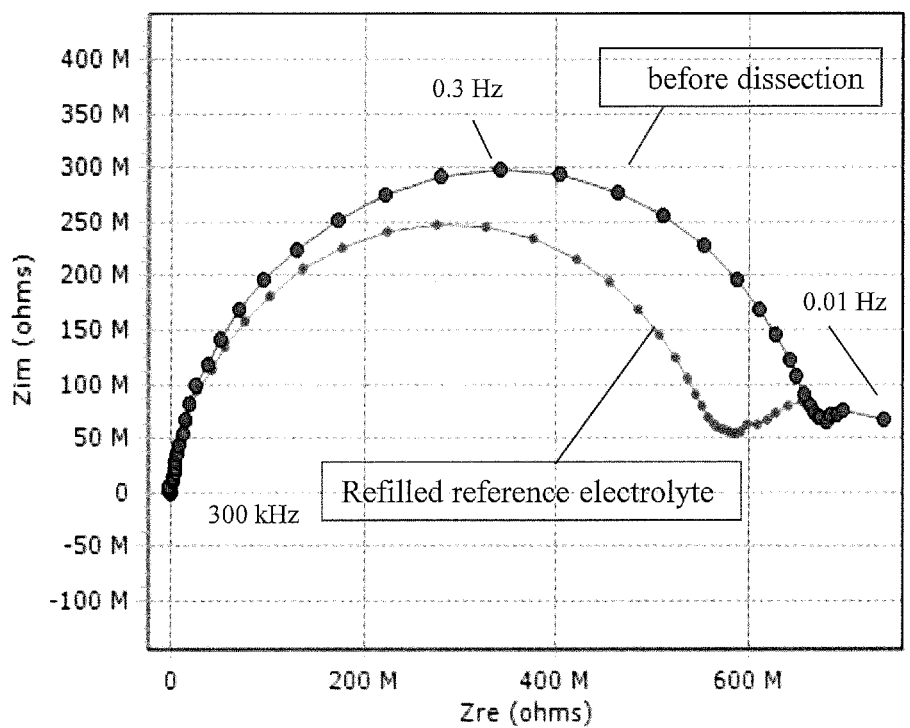
FIG. 7 shows Nyquist plots of impedance frequency response spectra of a defect sensor before and after a repair procedure, according to an embodiment of the present disclosure.

Among the key components of pH sensor reference cells, the reference electrolyte (i.e., the second electrolyte 32 for a single junction pH sensor; or the third electrolyte 34 for a double junction pH sensor) is commonly a point of failure. To investigate the failure mode of Sensor A-3 further, its reference electrolyte was replaced by drilling a hole through the housing of Sensor A-3, flushing out the reference electrolyte with deionized water, and refilling the emptied volume with fresh reference electrolyte. Then, the Sensor A-3 was tested and exhibited normal performance. FIG. 7 shows the measured impedance frequency response spectra before and after the replacement of the reference electrolyte. Thus, the differences of measured impedance frequency response characteristics have been proven useful for identifying reference cell failure modes as well.

Figure 8:
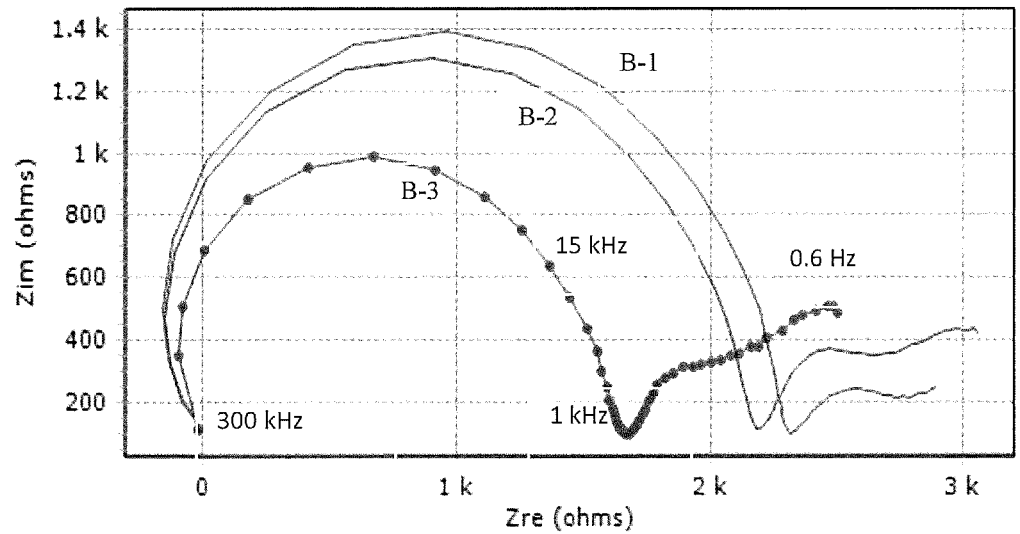
FIG. 8 shows Nyquist plots of impedance frequency response spectra of three test sensors, according to an embodiment of the present disclosure.

For Sensors B-1 and B-2, since the reference electrolyte was solid, refilling the reference electrolyte was not possible. Therefore, further information was sought concerning the reference electrolyte using the method 100. FIG. 8 shows the measured impedance frequency response spectra for the Sensors B-1, B-2 and B-3 measured between the reference electrode 22 and an external reference electrode (i.e., Ref-Ref(ext)). The three resulting impedance spectra shown in FIG. 8 generally have a similar shape, but the failed sensors (B-1 and B-2) have higher Ref-Ref(ext) impedance than the good sensor (B-3), indicating possibly lower porosity, smaller pore size, clogging of the pores, or simply higher material density of the failed sensors' reference electrolyte, where no other defects are found with the reference cells. Thus, FIG. 8 demonstrates that the method 100 may provide valuable guidance for further analysis and problem solving of such failure modes.

Experiment 2

The method 100 was further applied to characterize and analyze the effects of steam sterilization on the glass membrane in a pH sensor, such as the sensor 10. Steam sterilizable ("SS") pH sensors having membranes made with old SS glass and new SS glass were tested and compared with two SS pH sensors made by other manufactures (i.e., Sensors C1 and C2). The terms old SS glass and new SS glass simply indicate two different types of glass membranes used in the sensors under test. One means of simulating the effects of the steam sterilization process on a pH sensor is to condition the sensor in a steam-in-place ("SIP") test. The SIP test used in each experiment disclosed herein included inserting at least the membrane of the pH sensor in a pipe conveying steam of at least 100° C. for 30 minutes, cooling the sensor down to room temperature, then repeating the steam exposure and cooling processes for a total of three cycles. After the SIP test, the sensors were soaked in a 3-molar potassium chloride (KCl) solution for 60 hours.

Table 2 contains the pH test results and measured impedance frequency response data using the method 100 for the pH sensor with old SS glass before and after the SIP test and after surface treatment. The surface treatment included etching and cleaning the glass membrane with hydrofluoric acid (i.e., HF). "Etching I" indicates that the outside surface of the glass membrane was treated for 5 minutes (mins) in 10% HF and cleaned with deionized water. "Etching II" indicates that the inside surface of the glass membrane was treated for 5 minutes (mins) in 10% HF and cleaned with deionized water. The old SS glass sensor was evaluated using method 100 between each conditioning and treatment step. The impedance spectra data (C, R, $Y_o$, and $\sigma$) in Table 2 were calculated using the simulation software with the equivalent circuit shown in FIG. 4B.

After the SIP test, the sensor was out of specification. Specifically, though the capacitance and resistance of the glass membrane were comparable to that of the sensor before SIP exposure, the Warburg coefficient ($\sigma$) representing diffusion resistance, increased from 12 to 90 MW·s$^{-1/2}$. After etching I, the voltage output of sensor in the three standard pH buffer solutions was back to normal, although response time was still longer than a new sensor. Without being bound to a specific theory, Applicant suggests that the etching surface treatment caused the glass membrane to become thinner and hence lower in resistance and higher in capacitance, while at the same time the diffusion resistance (i.e., the Warburg coefficient) also decreased to 39 Mw·s$^{-1/2}$.

Figure 9A:
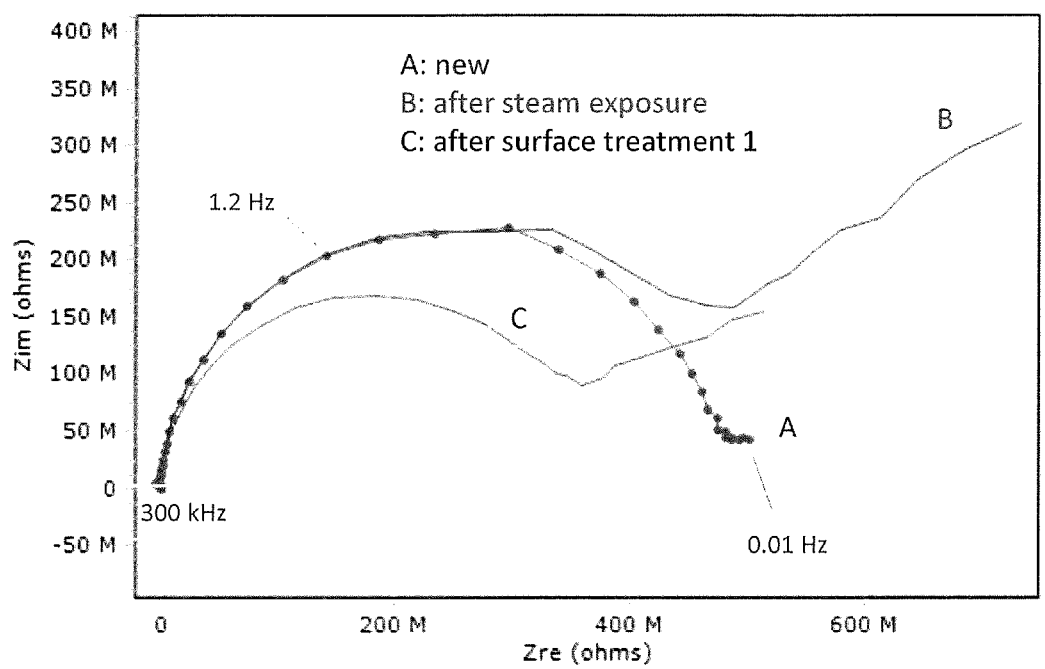
FIGS. 9A and 9B show Nyquist plots of impedance frequency response spectra of a test sensor before and after conditioning and surface treatment, according to an embodiment of the present disclosure.
Figure 9B:
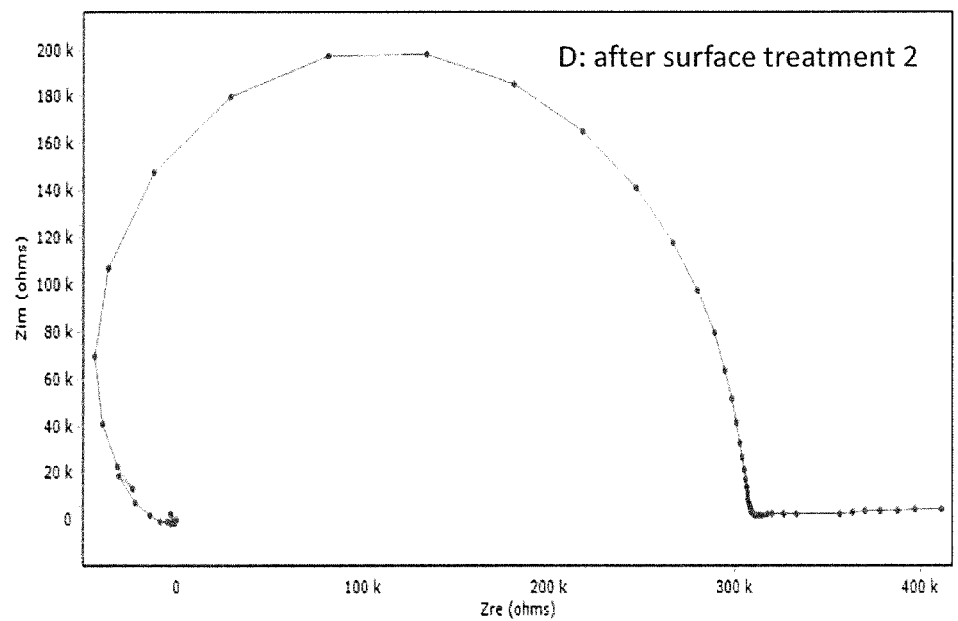

FIG. 9A shows the impedance spectra of the old SS glass sensor before and after SIP test and after etching I of the pH glass membrane. FIG. 9B shows the impedance spectra of the old SS glass sensor after etching II of the pH glass membrane. As shown in FIG. 9B, after etching II, the sensor functioned similar to new. Applicant suggests that the etching II treatment caused the glass membrane to become even thinner and thus further lowered impedances. After the second surface treatment, the shape of the impedance spectrum was generally similar to that of a new sensor. Consequently, the method 100 indicates and quantifies how the SIP process changed the material of the glass membrane and how the material change very likely occurred only in a limited layer on the outside and inside surfaces of the glass membrane.

Experiment 3

The method 100 was further applied to characterize and analyze the effects of steam sterilization on the glass membrane in pH sensors, such as the sensor 10, manufactured by other manufacturers. Steam sterilizable ("SS") pH sensors having membranes made with new SS glass manufactured by the Applicant (labeled "E+H") were tested and compared with two SS pH sensors made by other manufactures (i.e., Sensors C1 and C2). The SIP test described with respect to Experiment 2 was used to condition the sensor test samples in Experiment 3 as well.

Table 3 contains the pH test results and measured impedance frequency response data using the method 100 for Applicant's pH sensor (i.e., Sensor E+H) and for Sensors C1 and C2 before the SIP test. The impedance spectra data (C, R, $Y_o$, and $\sigma$) in Table 3 were calculated using the simulation software with the equivalent circuit shown in FIG. 4B. The $\sigma$ values were calculated using EQN. 5, and the C values were calculated with using EQN. 7. The highlighted mV datum is out of specification.

TABLE 2 pH Test and Impedance Data of a Sensor Made with Old SS Glass

| | mV reading in pH buffers | | | | | | | $\sigma$ |
|---|---|---|---|---|---|---|---|---|
| Condition | 4<br>177.5 ± 12 | 7<br>0 ± 12 | 10<br>−177.5 ± 12 | response time (s) | C (pF) | R (MΩ) | $Y_o$ (S · s$^{1/2}$) | (MΩ s$^{-1/2}$) |
| new | 170 | −5 | −177 | 15 | 370 | 460 | 5.80 × 10$^{-8}$ | 12 |
| after SIP | 162 | −26 | −199 | 50 | 371 | 400 | 7.83 × 10$^{-9}$ | 90 |
| after etching I | 172 | 5 | −175 | 34 | 465 | 327 | 1.8 × 10$^{-8}$ | 39 |

TABLE 3 pH Test and EIS Data of SS pH Sensors as New

| pH Sensor | mV reading in pH buffers | | | C (pF) | R (MΩ) | $Y_o$ (S·s$^{1/2}$) | σ (Ω·s$^{-1/2}$) | $|Z|_{total}$ at 0.01 Hz (MΩ) |
|---|---|---|---|---|---|---|---|---|
| | 4<br>177.5 ± 12 | 7<br>0 ± 12 | 10<br>−177.5 ± 12 | | | | | |
| C1 | 174 | 0 | −170 | 79 | 190 | 2.10 × 10$^{-8}$ | 34 | 336 |
| C2 | 179 | 5 | −164 | 317 | 434 | 7.52 × 10$^{-8}$ | 9 | 462 |
| E + H | 172 | −3 | −174 | 207 | 265 | 3.70 × 10$^{-8}$ | 19 | 341 |

Table 4 contains the pH test results and measured impedance frequency response data using the method 100 for Applicant's pH sensor (i.e., Sensor E+H) and for Sensors C1 and C2 after the SIP test. The impedance spectra data (C, R, $Y_o$, and σ) in Table 4 were calculated using the simulation software with the equivalent circuit shown in FIG. 4B. The σ values were calculated using EQN. 5, and the C values were calculated with using EQN. 7. The highlighted mV data are out of specification.

TABLE 4 pH Test and EIS Data of the SS pH Sensors after SIP Test

| pH Sensor | mV reading in pH buffers | | | C (pF) | R (MΩ) | $Y_o$ (S·s$^{1/2}$) | σ (Ω·s$^{-1/2}$) | $|Z|_{total}$ at 0.01 Hz (MΩ) |
|---|---|---|---|---|---|---|---|---|
| | 4<br>177.5 ± 12 | 7<br>0 ± 12 | 10<br>−177.5 ± 12 | | | | | |
| C1 | 149 | 22 | −193 | 66 | 160 | 1.14 × 10$^{-8}$ | 62 | 472 |
| C2 | 164 | 9 | −177 | 294 | 356 | 1.59 × 10$^{-8}$ | 45 | 547 |
| E + H | 170 | 2 | −177 | 200 | 280 | 7.20 × 10$^{-8}$ | 98 | 723 |

Figure 10A:
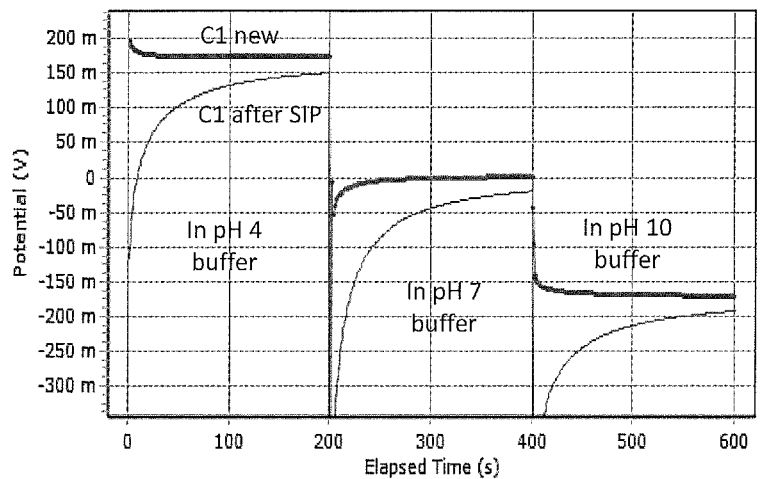
FIGS. 10A-10C show pH measurements in millivolts (mV) against time in seconds (s) for test sensors before and after conditioning, according to an embodiment of the present disclosure.
Figure 10B:
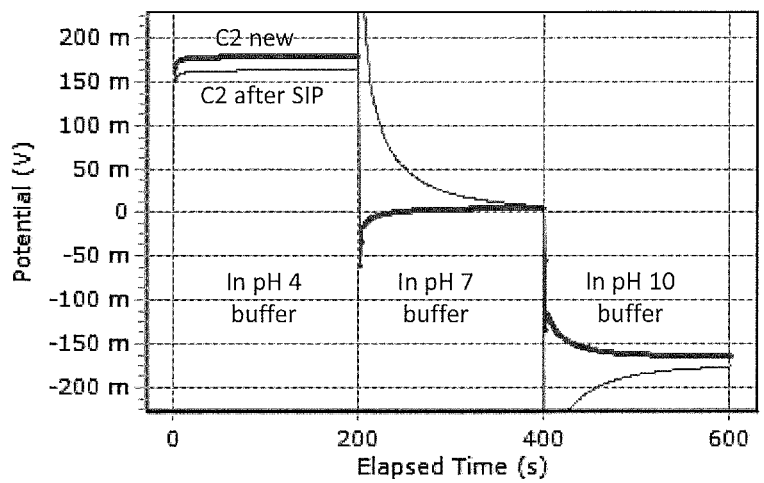
Figure 10C:
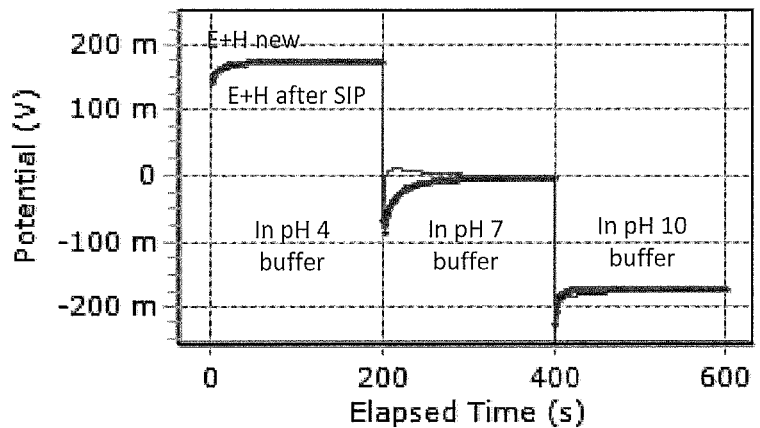
Figure 11A:
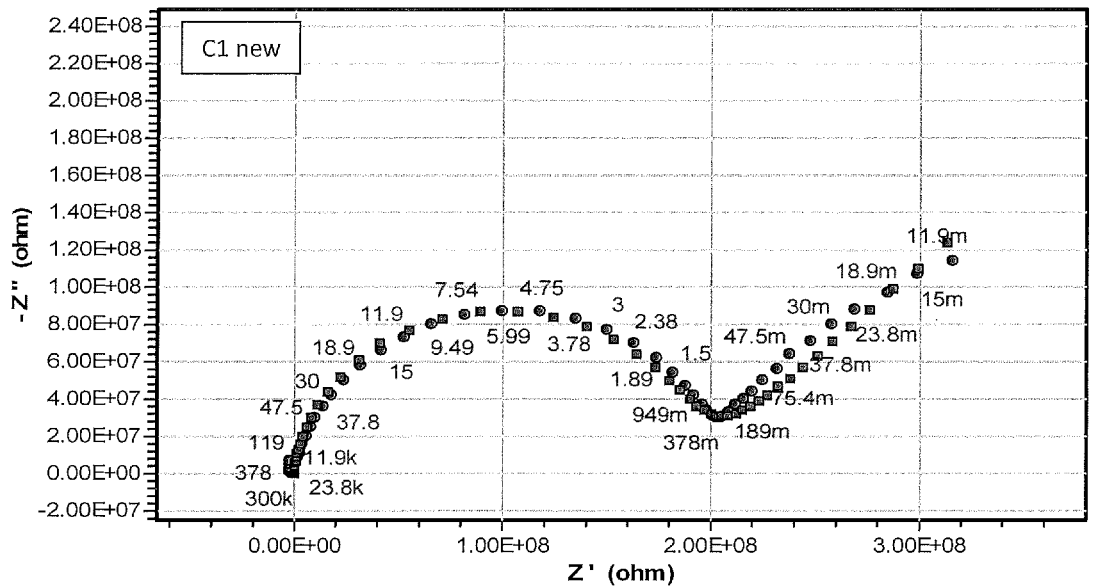
FIGS. 11A-11F show Nyquist plots of impedance frequency response spectra of three test sensors before and after conditioning, according to an embodiment of the present disclosure.
Figure 11B:
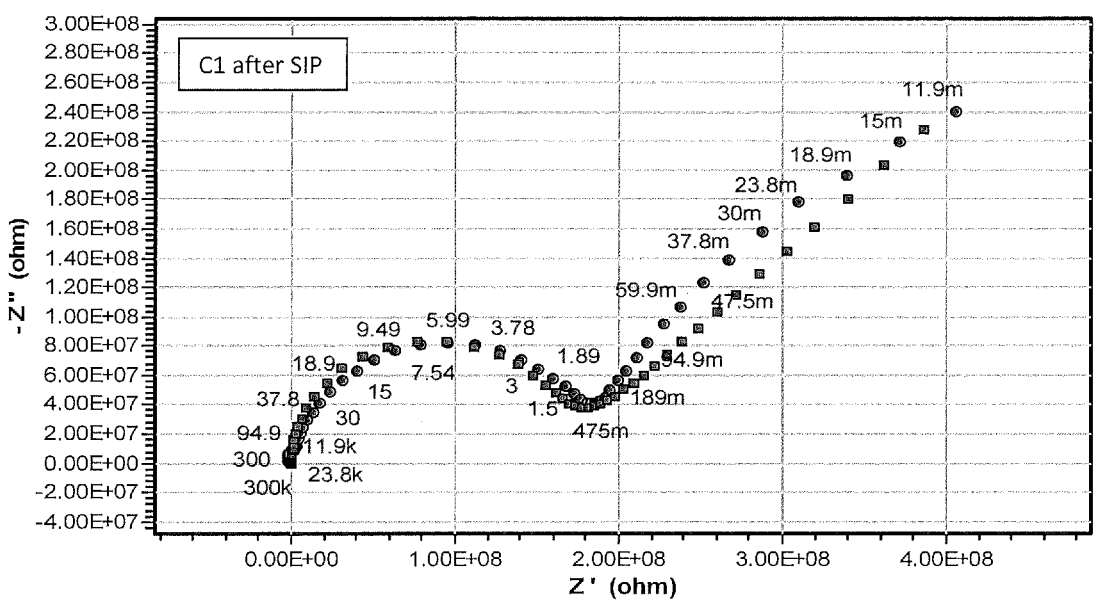
Figure 11C:
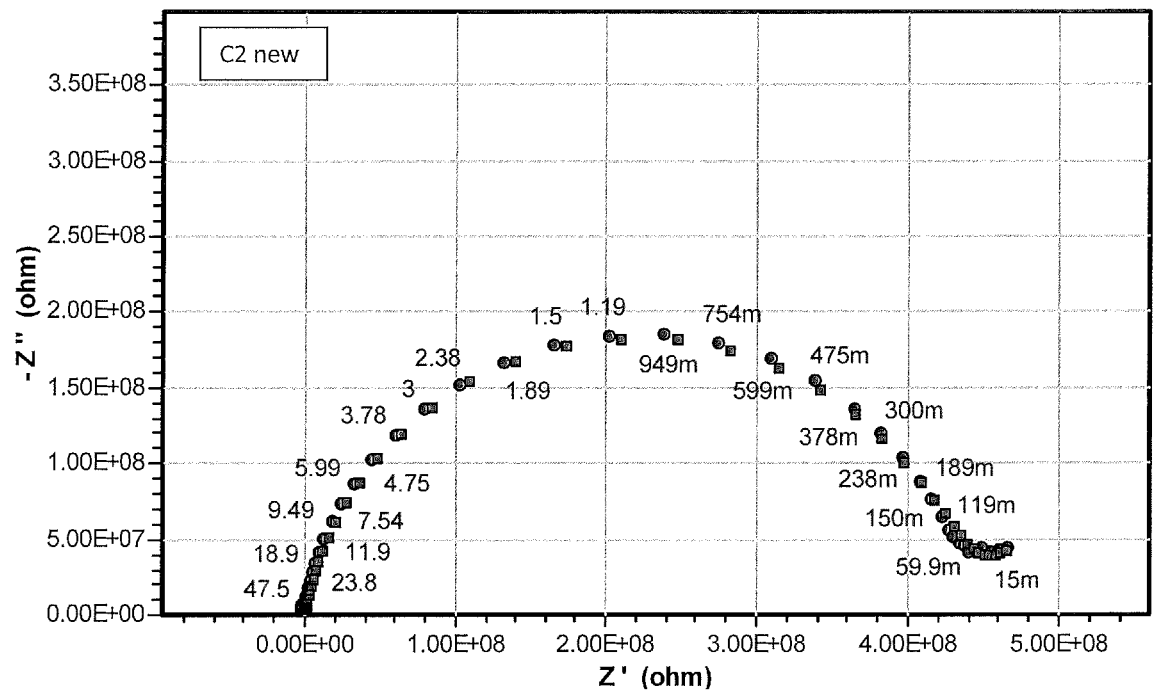
Figure 11D:
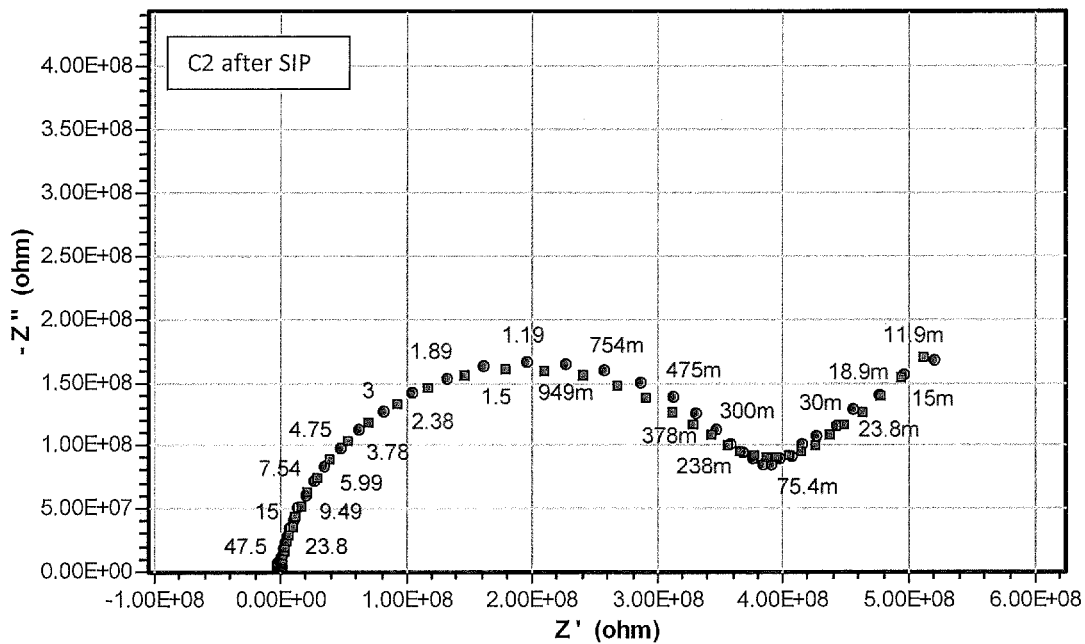
Figure 11E:
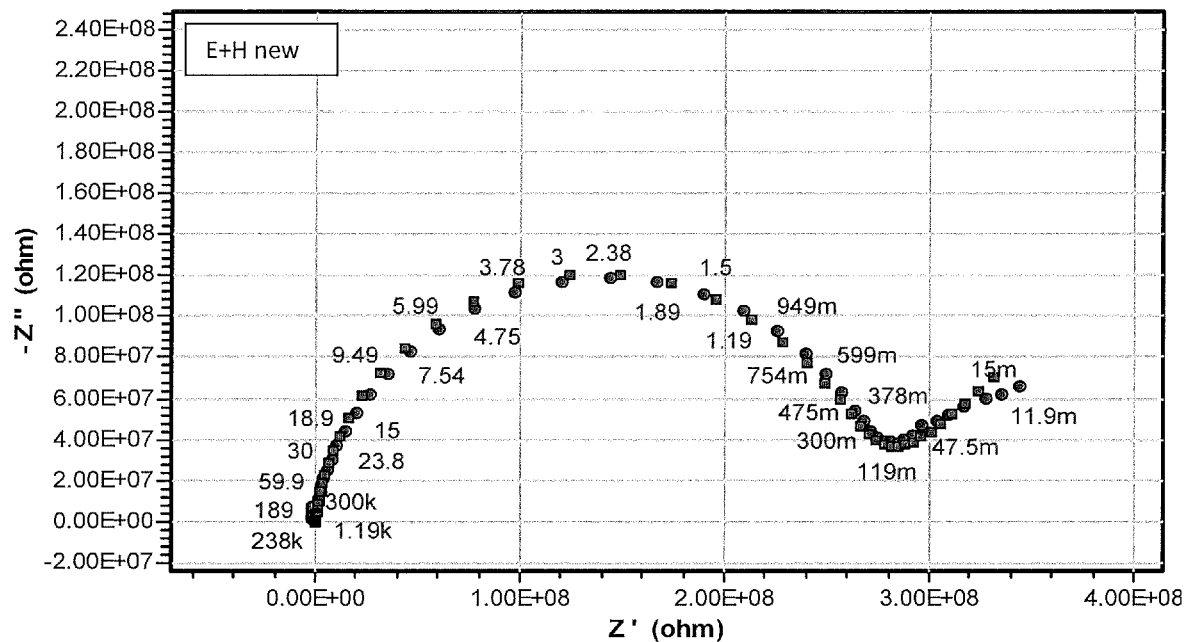
Figure 11F:
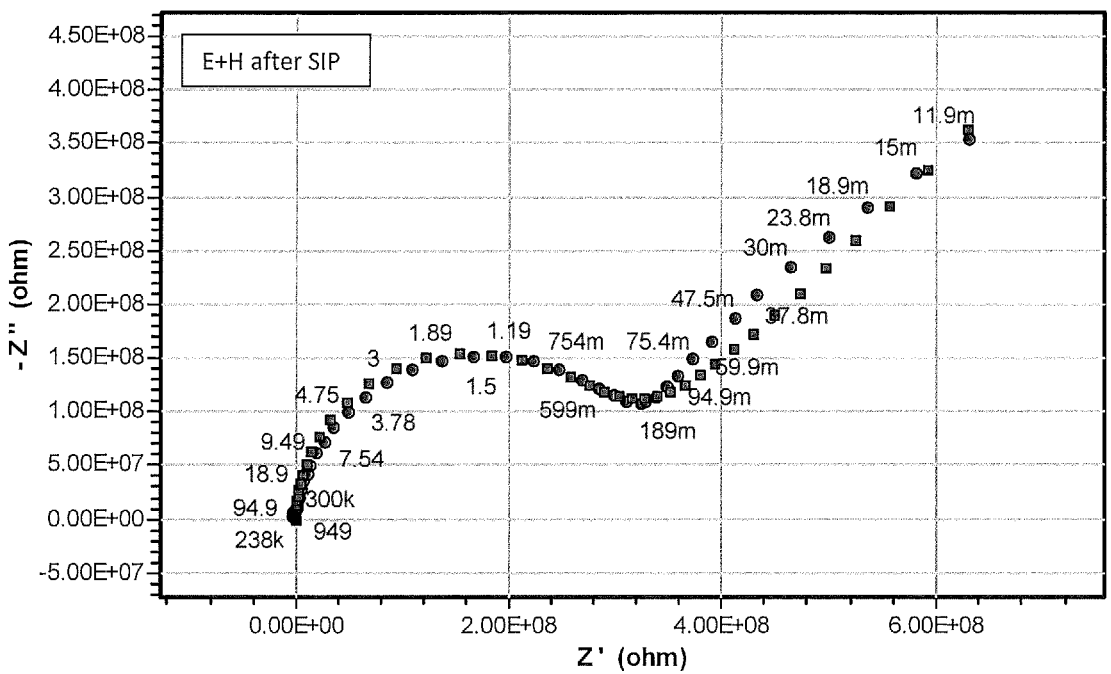

FIGS. 10A-10C show the time-based pH test results in voltage output (i.e., mV readings versus time) of the E+H, C1 and C2 sensors before and after the SIP test. FIGS. 11A-11F show the Nyquist plots of the measured impedance frequency response spectra for the three sensors before and after SIP test. The circular dots are measured data points; the squares are fitted data points.

The pH test results of Tables 3 and 4 indicate: (1) the three SS pH sensors were all within specifications before SIP test, except that Sensor C2 was slightly lower than specification in pH 10 buffer; and (2) after the SIP test, Sensor C1 was completely out of specification, Sensor C2 was within specification in pH 7 and 10 buffers but slightly below specification in pH 4 buffer, and Sensor E+H was within specification in all three pH buffers. From FIGS. 10A-10C, Sensor E+H had a faster response than either Sensor C1 or C2.

The measured impedance frequency response spectra of FIGS. 11A-11F show: (1) the three sensors have no significant difference on total glass impedance (either before or after SIP test), which is in the normal range of pH sensors; (2) Sensor E+H exhibited lower resistance and capacitance than Sensor C2, which at least partially explains Sensor E+H's faster response because lower resistance and capacitance yields a smaller RC time constant and hence faster charge and discharge processes; and (3) if the capacitance is too low, the glass membrane does not have enough sensing capability for the H$^+$ in a test solution, as in the case of Sensor C1 after the SIP test (capacitance, C, was only 66 pF). Further, the point of balance between response time and sensing capability seems to be somewhere between 66 pF and 79 pF for Sensor C1.

As demonstrated by the Experiments 1, 2 and 3, the method 100 provides an understanding the effects of a sensor's impedance components, both individually and interactively, on sensor performances, and the method 100 enables a correlation between sensor impedance components and sensor performances. Moreover, the method 100 was shown to be very useful for failure mode analysis of sensors, particularly for identifying glass bulb cracks, short circuits, open circuit, and reference cell problems in pH sensors. Further, the method 100 was shown to be useful for evaluating the effects of material type, operating conditions and surface treatments on sensor performance. Therefore, the method 100 may be applied to both quality control of manufactured sensors and root cause failure mode analysis or monitoring of sensors deployed in the field.

Accordingly, in at least one embodiment, the step 110 of the method 100 may include identifying whether the total impedance is below a lower threshold or above an upper threshold and/or whether the imaginary component of the total impedance is predominantly greater than or less than zero. Using the method 100, a sensor in which the total impedance is below the lower threshold and the imaginary component is predominantly greater than zero may be characterized as having a defect in a membrane of the sensor. A sensor in which the total impedance is below the lower threshold and the imaginary component is predominantly less than zero may be characterized as having a short circuit. Further, a sensor in which the total impedance at the low frequency end is above the upper threshold and the real/imaginary component ratios are predominantly less than a ratio threshold is characterized as having an open circuit. In certain embodiments, determining whether the real/imaginary component ratio is predominantly less than the ratio threshold may include.

In certain embodiments of the method 100, the lower threshold may be around 5 megaohms, and the upper threshold may be about 50 megaohms. In alternative embodiments, the lower threshold may be around 10 megaohms, and the upper threshold may be about 5 gigaohms. In at least one embodiment, the lower threshold may be around 1 megaohm. In certain embodiments of the method 100, the ratio threshold may be around 0.1. In certain embodiments, additionally or alternatively, the upper, lower and ratio thresholds may be ranges. The upper, lower and ratio threshold values disclosed are merely exemplary values. In operation, specific upper, lower and ratio threshold ranges and values to be applied in the method 100 for a given type of sensor are determined for the specific sensor type by characterizing a properly functioning sensor. Consequently, the appropriate upper, lower and ratio threshold values and/or ranges for a given implementation of the method 100 may be different than the exemplary values disclosed herein.

According to a further aspect of the present disclosure, a method for characterization and failure analysis of a measuring sensor with an integrated temperature sensor is disclosed. As shown in FIG. 1, the sensor 10 may include the temperature sensor 24 integrated therein. In at least one embodiment of the sensor 10, the temperature sensor 24 may be a thermocouple in which the lead lines 28 of the temperature sensor 24 are two different electrical conductors (labeled TC1 and TC2 in FIG. 1) that produce a temperature-dependent voltage as a result of the thermoelectric effect. The temperature-dependent voltage can be read by a meter (not shown) and thereby interpreted as a measured temperature. In such an embodiment, the measured temperature is the temperature of the first electrolyte 30 in which the temperature sensor 24 is immersed. Because the temperature of the first electrolyte 30 is same as that of the test solution 52 once thermal equilibrium between the two is reached, the temperature sensor 24 also measures the temperature of the test solution 52. In certain applications of the sensor 10, the same meter may be used to measure both the potential between the working electrode 20 and the reference electrode 22 (i.e., a measured value, e.g., a pH value) and the temperature sensor 24 (i.e., first electrolyte temperature) simultaneously.

The integrated temperature sensor 24 may include an enclosure 25, such as a glass tube as a non-limiting example, to electrically insulate the temperature sensor 24 from the first electrolyte 30, the reference electrode 22 and the working electrode 20. The lead lines 28 may further be insulated between the enclosure 25, the working electrode 20 and the reference electrode 22 by the back seal 44, for example, by epoxy insulation sealed at the enclosure 25 and back seal 44.

If the electrical insulation between the working electrode 20 and the integrated temperature sensor 24 or between the reference electrode 22 and the temperature sensor 24 is not adequate, electrical current may leak therebetween, and the current leakage may affect the voltage between the working electrode 20 and the reference electrode 22 (e.g., measured pH value), resulting in erroneous sensor measurements, for example, incorrect pH measurements. Potential failure modes of the sensor 10 include cracking (e.g., mechanical shock damage, stress cracking and thermal stress), including micro-cracking, of the temperature sensor enclosure 25 and insufficient electrical insulation of the temperature sensor 24. For example, insufficient electrical insulation between the lead lines 28 of the temperature sensor 24 and the reference electrode 22, for instance, at or downstream of the back seal 44, may enable current leakage therebetween.

Such defects may be difficult to recognize because the pH sensor (i.e., including working electrode 20 and reference electrode 22) and the integrated temperature sensor 24 may function properly when only the pH sensor or the temperature sensor 24 are connected to a meter one at a time. However, when both the pH sensor and the temperature sensor 24 are connected to a meter at the same time the voltages measured at each may not be completely independent, for example, due to a shared ground within the meter. Consequently, such co-dependent measurements may be meter-specific, causing the failure mode to seem inconsistent or intermittent depending on the kinds of meters used in operation.

Applicant has discovered that certain characteristics of a measured impedance frequency response spectrum can be used to analyze and identify different failure modes of the temperature sensor 24 in the sensor 10. Accordingly, the method 100 can be applied to determine a defect of the sensor 10 related to the temperature sensor 24 regardless of the type of meter used with the sensor 10 in operation or whether the working electrode 20, the reference electrode 22 and the temperature sensor 24 are connected to the meter at the same time. In such an embodiment of the method 100 of characterization and failure analysis of the sensor 10, the step 102 is modified to include applying an alternating current (AC) at a selected voltage to the sensor 10 between the working electrode 20 and the temperature sensor 24 and/or applying an alternating current (AC) at a selected voltage to the sensor 10 between the reference electrode 22 and the temperature sensor 24. Accordingly, the step 106 is modified to include measuring an impedance of the sensor 10 between the working electrode 20 and the temperature sensor 24, and/or measuring an impedance of the sensor 10 between the reference electrode 22 and the temperature sensor 24, over the range of frequencies of the alternating current.

Figure 12:
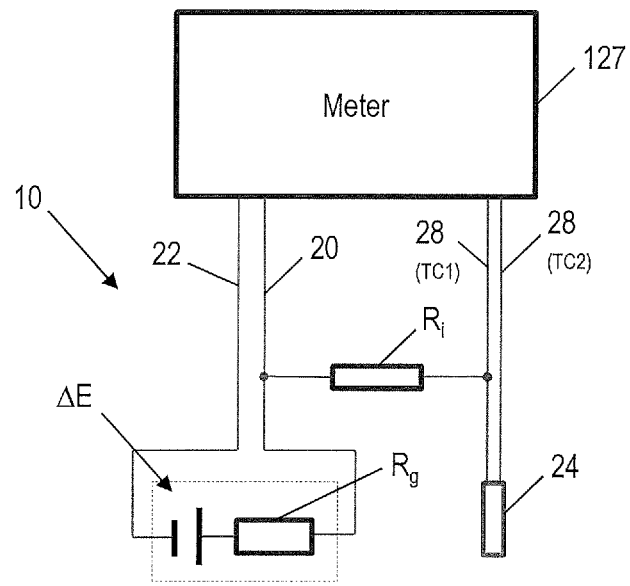
FIG. 12 shows an equivalent circuit, according to an embodiment of the present disclosure.

The electrical behavior of the sensor 10 having a defect in the temperature sensor 24 can be characterized with an equivalent circuit, as shown in FIG. 12. A defect in the insulation of the temperature sensor 24, e.g., a crack or insufficient insulation, creates a current path, having an impedance $Z_i$, e.g., a resistance $R_i$, between either lead line 28 of the integrated temperature sensor 24 (e.g., TC1 or TC2) and the working electrode 20. The equivalent circuit may include a potential difference between the reference electrode 22 and the working electrode 20 $\Delta E$ and a resistance of the membrane $R_g$. The defect may cause a meter 127 connected to both the sensor 10 and the temperature sensor 24 to incorrectly measure the potential difference $\Delta E$ between the reference electrode 22 and the working electrode 20.

Experiment 4

Figure 13:
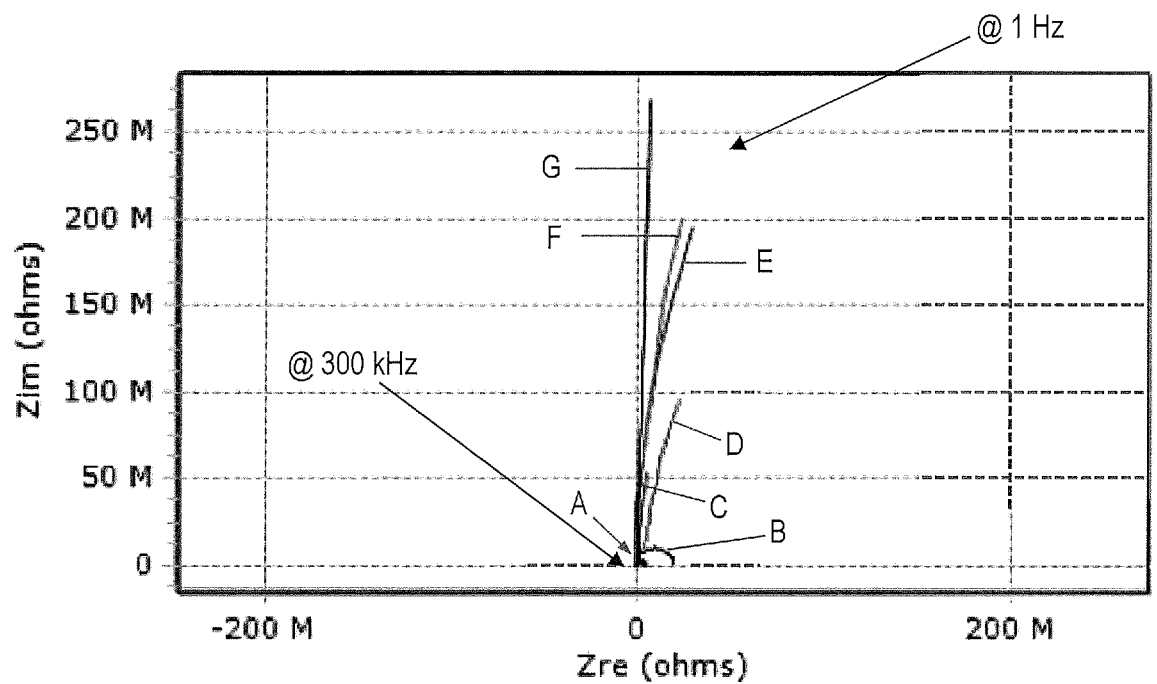
FIG. 13 show a Nyquist plot of impedance frequency response spectra of various field sensors, according to an embodiment of the present disclosure.

The method 100 was applied to several sensors returned from operation in the field. FIG. 13 shows a Nyquist plot of the measured impedance frequency response spectrum of the returned sensors, including sensors with defects, labeled A, B, C and D, and one without a defect, labeled F. The outer tips of the response curves indicate the response at the 1 Hz, low frequency end, extending toward the plot origin at a high-end frequency of 300 kHz. The sensor response labeled G shows the response of an idealized impedance between a working electrode and an integrated temperature sensor, represented by 10 linear feet of cable. As shown in FIG. 13, the plot for the idealized Sensor G shows a nearly vertical line with a large (e.g., greater than 250 MΩ) total impedance at 1 Hz including a positive imaginary component and a small, positive real component. Because in general a diameter of an impedance frequency response spectrum is proportional to the insulation resistance, the slight rightward slope of the response illustrates that Sensor G has a very large insulation resistance, as one of ordinary skill in the art having the benefit of the present disclosure would expect for an idealized sensor of 10 linear feet of cable.

The real-world Sensor F exhibits a similar response though with lesser impedance of around 200 MΩ at 1 Hz and with the greater rightward bending (i.e., lesser slope) indicating a smaller resistance than Sensor G. Contrast defective Sensors A and B, having very low total impedance (around 5 and 20 MΩ, respectively) and very small diameters of their response spectra (e.g., tight, relative small diameter semicircles). Defective Sensors C and D have larger, though relatively low, impedance (between 50 and 100 MΩ, respectively) at the low-end frequencies but relatively large diameter response spectra. Defective Sensor E provided incorrect measurements of pH in separate testing; however, the pH measurements were degrees of magnitude closer to true values than with Sensors A-D. The reported failure modes and correlated impedance frequency response characteristics have been corroborated and proven by physical dissection of Sensors A-F and others. Thus, the foregoing experiments demonstrate that poor electrical insulation between the working electrode and temperature sensor or between the reference electrode and temperature sensor can be non-destructively diagnosed using the method 100.

As demonstrated, the EIS characteristics of sensors with defective integrated temperature sensors having poor temperature sensor insulation include relatively low impedance between the working electrode and temperature sensor or between the reference electrode and temperature sensor, for example, $Z_i$ below a target impedance value $Z_e$. A further characteristic of such defective sensors includes relatively low resistance between the temperature sensor and the working electrode, for example, $R_i$ less than a target resistance value $R_q$, which may be alternatively expressed as the ratio of the imaginary component to the real component of the impedance less than a target ratio, q:

$$Z_{im}/Z_{re} < q.$$

The target impedance value $Z_e$, target resistance value $R_q$, and target ratio, q are constants for a given meter hardware and sensor membrane impedance $Z_g$ of the ion-sensitive membrane of the working electrode, for example, a pH-sensitive glass membrane. The constants $Z_e$, $R_q$ and q may thus be pre-determined experimentally for the given meter hardware and membrane impedance $Z_g$. To illustrate, simulations were performed to determine the minimum impedance between the working electrode and temperature sensor $Z_i$ for a given membrane impedance, represented by membrane resistance $R_g$ per the equivalent circuit of FIG. 12. The results of the simulations are plotted in FIG. 14, as a simulation of pH value over varying resistance between the temperature sensor and the working electrode $R_i$. As shown in FIG. 12, the minimum Ri for a properly functioning pH sensor depends on the resistance (and thus impedance) of the membrane, Rg, which depends on the type of membrane materials used, for example, the type of ion-sensitive glass membrane and its thickness.

Figure 14:
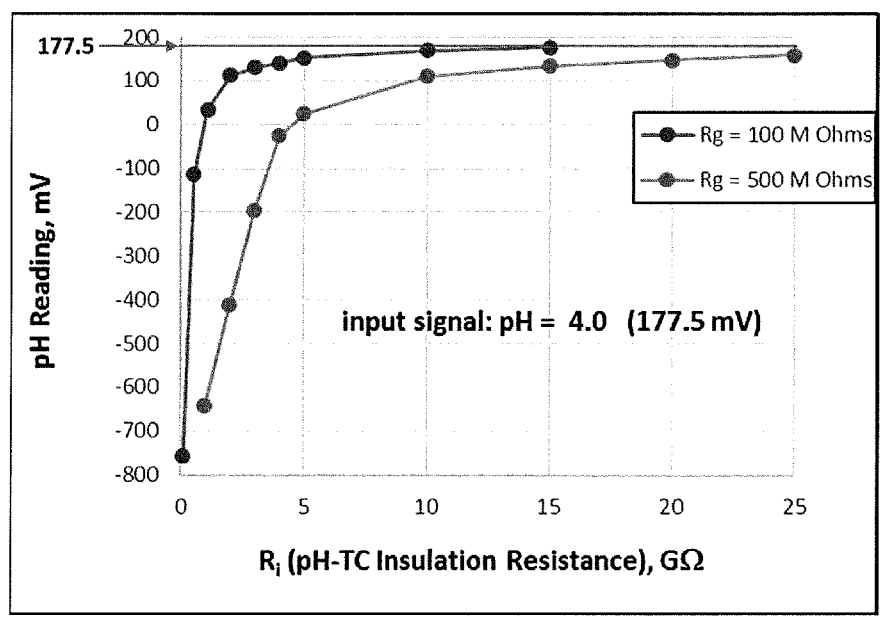
FIG. 14 shows voltage potential in mV over insulation resistance in gigaohms (GΩ).

In the simulation, a target measured pH value of 4 was selected, which correlates to a voltage of 177.5 mV between the working and reference electrodes, as described further herein. For a sensor having a membrane resistance $R_g$ of 100 MΩ, the resistance between the temperature sensor and the working electrode $R_i$ must be greater than or equal to about 15 GΩ. For a sensor having a membrane resistance $R_g$ of 500 MΩ, the resistance between the temperature sensor and the working electrode $R_i$ must be greater than about 25 GΩ. In fact, as shown in FIG. 14, the "true" pH value (correlated to 177.5 mV) is not reached in the simulation until some resistance $R_i$ greater than 25 GΩ. Consequently, in operation, the specific minimum impedance between the temperature sensor and the working electrode $Z_i$ and the target ratio of its imaginary and real components q to be applied in the method 100 for a given type of sensor are determined for the specific sensor type by characterizing a properly functioning sensor of that type on the kind of meter used in operation. Consequently, the appropriate target values and/or ranges for a given implementation of the method 100 may be different than the exemplary values disclosed herein.

While various embodiments of a method for characterizing and analyzing a sensor have been described in considerable detail herein, the embodiments are merely offered by way of non-limiting examples of the disclosure described herein. It will therefore be understood that various changes and modifications may be made, and equivalents may be substituted for elements and steps thereof, without departing from the scope of the disclosure. Indeed, this disclosure is not intended to be exhaustive or to limit the scope of the disclosure.

Further, in describing representative embodiments, the disclosure may have presented a method and/or process as a particular sequence of steps. However, to the extent that the method or process does not rely on the particular order of steps set forth herein, the method or process should not be limited to the particular sequence of steps described. Other sequences of steps may be possible. Such sequences may be varied and remain within the scope of the present disclosure. Therefore, the particular order of the steps disclosed herein should not be construed as limitations of the present disclosure.

The invention claimed is:

1. A method of characterization and failure analysis of a measuring sensor, the method comprising:
    applying an alternating current having a frequency at a selected voltage to a measuring sensor, wherein the voltage is applied between a working electrode of the measuring sensor and a temperature sensor integrated into the measuring sensor and/or between a reference electrode of the measuring sensor and the temperature sensor, wherein the measuring sensor includes an ion-sensitive membrane and electrical insulation between the temperature sensor, the working electrode and the reference electrode;
    varying the frequency of the alternating current between a lower frequency and an upper frequency over a range having a low frequency end and an upper frequency end, wherein the varying defines a scan;
    measuring an impedance of the measuring sensor between the working electrode and the temperature sensor, and/or between the reference electrode and the temperature sensor, from a single scan over the range of frequencies of the alternating current;
    analyzing the measured impedance to determine a total impedance between the working electrode and the temperature sensor, and/or between the reference electrode and the temperature sensor, and the real and imaginary components of the total impedance at and over the applied frequencies of the alternating current; and
    determining whether, based on the total impedance and on the real and imaginary components of the total impedance, the measuring sensor has a defect in the insulation between the working electrode and the temperature sensor or between the reference electrode and the temperature sensor.

2. The method of claim 1, the method further comprising generating a measured impedance frequency response spectrum.

3. The method of claim 1, wherein the determining includes identifying whether the total impedance at the low frequency end between the working electrode, and/or the reference electrode, and the temperature sensor is below a lower threshold.

4. The method of claim 3, wherein a measuring sensor in which the total impedance at the low frequency end is below the lower threshold is determined to have a defect in the insulation between working electrode and temperature sensor or between reference electrode and temperature sensor.

5. The method of claim 3, wherein the lower threshold is based at least in part on a membrane impedance of the ion-sensitive membrane of the measuring sensor.

6. The method of claim 5, wherein the lower threshold is around 15 gigaohms when the membrane impedance is about 100 megaohms.

7. The method of claim 5, wherein the lower threshold is around 25 gigaohms, when the membrane impedance is about 500 megaohms.

8. The method of claim 3, the method further comprising generating a Nyquist plot of a measured impedance frequency response spectrum, wherein a measuring sensor in which the total impedance at the low frequency end is below the lower threshold and the measured impedance frequency response spectrum deviates toward a positive real component at the low frequency end in the Nyquist plot is determined to have a defect in the insulation between working electrode and temperature sensor or between reference electrode and temperature sensor.

9. The method of claim 8, wherein the measured impedance frequency response spectrum deviates toward a positive real component in the Nyquist plot when a ratio of the imaginary to real components of the measured impedance at the low frequency end is less than a target ratio, wherein the target ratio is at least partially based on a membrane impedance of the ion-sensitive membrane of the measuring sensor.

10. The method of claim 1, the method further comprising:
data fitting the measured impedance to generate a simulated response spectrum; and
applying an equivalent circuit model to the simulated response spectrum to estimate the capacitance, resistance and Warburg coefficient of the measuring sensor.

11. The method of claim 10, wherein the determining includes predicting a performance of the measuring sensor using the estimated the capacitance, resistance and Warburg coefficient.

12. The method of claim 1, wherein the analyzing includes generating a plot of the measured impedance as a function of the frequency of the alternating current to yield a frequency response spectrum.

13. The method of claim 12, wherein the plot is a Nyquist plot.

14. The method of claim 1, wherein the frequency of the alternating current is varied over a spectrum.

15. The method of claim 1, wherein the frequency of the alternating current is varied between discrete predetermined frequencies.

16. The method of claim 1, wherein the measuring sensor is a pH sensor.

17. The method of claim 1, wherein the determining is included as a step in a quality control process.

18. The method of claim 1, wherein determining includes checking a status of the sensor.

19. The method of claim 1, wherein the measuring sensor includes equipment suitable to perform the measuring of the impedance of the sensor at various frequencies.

20. The method of claim 19, wherein the equipment is integrated into a plug head of the measuring sensor.

* * * * *